(12) United States Patent
Verma et al.

(10) Patent No.: US 9,294,078 B1
(45) Date of Patent: Mar. 22, 2016

(54) VOLTAGE-DRIVER CIRCUIT WITH DYNAMIC SLEW RATE CONTROL

(71) Applicants: Chetan Verma, Noida (IN); Geetansh Arora, Faridabad (IN); Amit Roy, Noida (IN)

(72) Inventors: Chetan Verma, Noida (IN); Geetansh Arora, Faridabad (IN); Amit Roy, Noida (IN)

(73) Assignee: REESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/480,642

(22) Filed: Sep. 9, 2014

(51) Int. Cl.
*H03K 5/12* (2006.01)
*H03K 5/24* (2006.01)
*H03K 5/1534* (2006.01)

(52) U.S. Cl.
CPC .............. *H03K 5/12* (2013.01); *H03K 5/1534* (2013.01); *H03K 5/24* (2013.01)

(58) Field of Classification Search
CPC ......... H03K 5/12; H03K 5/24; H03K 5/1534; H01L 27/7869; H01L 27/1225; H01L 27/1248; H01L 29/227; H03F 1/3241; H03F 1/3247; H03F 1/3258; H03F 3/24; H03F 3/72; H04B 1/709; H04B 11/00; H04B 13/02; H04B 1/0857; H04B 1/0874
USPC .......................................... 327/170, 172, 175
See application file for complete search history.

(56) References Cited

U.S. PATENT DOCUMENTS

| | | | |
|---|---|---|---|
| 5,568,081 A | 10/1996 | Lui | |
| 6,784,708 B1 | 8/2004 | Krenzke | |
| 6,906,567 B2 | 6/2005 | Culler | |
| 7,768,433 B2 | 8/2010 | Mathe | |
| 7,924,066 B2 | 4/2011 | Gagne | |
| 2003/0146791 A1* | 8/2003 | Shvarts | H03F 1/025 330/297 |
| 2004/0140833 A1 | 7/2004 | Kim | |
| 2013/0181751 A1 | 7/2013 | Chen | |

FOREIGN PATENT DOCUMENTS

EP 2120123 11/2009

* cited by examiner

*Primary Examiner* — John Poos
(74) *Attorney, Agent, or Firm* — Charles E. Bergere

(57) ABSTRACT

A system for circuit for generating an output signal with a dynamically adjustable slew rate includes a sampler, an envelope detector, an envelope comparison and control circuit, and a voltage-driver circuit that includes output buffers for generating the output signal. The sampler generates a sampled signal indicative of the slew rate of the output signal. The envelope detector generates an envelope detection signal indicative of a peak value of the sampled signal. The envelope comparison and control circuit compares a voltage level of the envelope detection signal with various threshold voltage levels, and generates control signals. The voltage-driver circuit controls the operation states of the output buffers based on the control signals to dynamically adjust the slew rate of the output signal.

17 Claims, 4 Drawing Sheets

VOLTAGE-DRIVER CIRCUIT WITH DYNAMIC SLEW RATE CONTROL

BACKGROUND OF THE INVENTION

The present invention generally relates to integrated circuits, and, more particularly, to voltage-driver circuits having dynamic slew rate control.

Integrated circuits (ICs) including System on Chip (SoCs) integrate various digital and analog components on a single chip. The ICs communicate with different types of external components, such as dynamic random access memories (DRAMs), double-data rate (DDR) memories, and Ethernet and universal serial data-bus (USB) devices. To facilitate the communication between an IC and the external components, the IC includes input/output (IO) drivers, also referred to as voltage-driver circuits. The voltage-driver circuits perform various IO operations, such as driving voltage signals from the IC to the external components, receiving and conditioning data signals from the external components, and providing electrostatic protection to the IC.

The voltage-driver circuit must output an output signal having a constant slew rate regardless of the type of the external component connected to the IC. However, for each type of external component, the load impedance at the output of the voltage-driver circuit changes based on the power consumed by the external component. Change in the load impedance leads to a change in the slew rate of the output signal received by the external component. Therefore, to ensure that the external component receives an output signal having a constant slew rate, the slew rate of the output signal generated at the output of the voltage-driver circuit must be modified. To facilitate modification of the slew rate of the output signal, the voltage-driver circuit includes multiple output buffers. Generally, output buffers include transistors, capacitors, and resistors. Each output buffer has an input terminal connected to a reference voltage generator for receiving a reference voltage signal and an output terminal for outputting the reference voltage signal having a distinct slew rate as an intermediate output signal. Each output buffer further includes an enable terminal that is connected to a processor. Based on the type of external component, the processor is programmed to generate and provide a set of control signals to the output buffers, thereby controlling the operational state of the output buffers. The voltage-driver circuit collectively outputs the intermediate output signals generated by the output buffers having distinct slew rates as the output signal. Therefore, the slew rate of the output signal depends on the operational state of the output buffers.

FIG. 1 shows a conventional IC 100 connected to a variable load 102 by way of a voltage-driver circuit 104. The variable load 102 is representative of an external component connected to the IC 100. The IC 100 further includes a processor 106 connected to the voltage-driver circuit 104. The voltage-driver circuit 104 includes first through third output buffers 108-112 and first and second reference voltage generators 114 and 116. The first and second reference voltage generators 114 and 116 generate an enable signal and a supply voltage signal, respectively.

The first output buffer 108 has an input terminal connected to the second reference voltage generator 116 for receiving the supply voltage signal, an enable terminal connected to the first reference voltage generator 114 for receiving the enable signal, and an output terminal for providing a first intermediate output signal having a first slew rate. The second output buffer 110 has an input terminal connected to the second reference voltage generator 116 for receiving the supply voltage signal, an enable terminal connected to the processor 106 for receiving a first control signal, and an output terminal for providing a second intermediate output signal having a second slew rate. The third output buffer 112 has an input terminal connected to the second reference voltage generator 116 for receiving the supply voltage signal, an enable terminal connected to the processor 106 for receiving a second control signal, and an output terminal for providing a third intermediate output signal having a third slew rate.

Based on the type of the variable load 102 connected to the IC 100, the processor 106 is programmed to generate and provide the first and second control signals to the second and third output buffers 110 and 112. The voltage-driver circuit 104 collectively outputs the first, second and third intermediate output signals generated by the output buffers as the output signal. Thus, the processor 106 configures the operational modes of the second and third output buffers 110 and 112, thereby controlling the slew rate of the output signal. For example, to decrease the slew rate of the output signal, the processor 106 generates the first and second control signals to switch off the second and third output buffers 110 and 112. Thus, the voltage-driver circuit 104 outputs only the first intermediate output signal as the output signal having a slew rate equivalent to the first slew rate.

However, the power consumed by the external component, i.e., the power consumed by the variable load 102 varies based on the type of the external component. For example, a USB device may consume more power than the power consumed by a DRAM. Thus, the load impedance on the voltage-driver circuit 104 varies based on the type of the variable load 102. The type of printed circuit board (PCB, not shown) used to mechanically support and electrically connect the IC 100 and the variable load 102 also leads to variations in the load impedance. The load impedance also changes based on various environmental conditions, such as ambient temperature and the temperature of the PCB. Further, the composition of the electrical connections decays and changes over time (aging), leading to a gradual change in the load impedance. Variation in the load impedance leads to a change in the slew rate of the output signal. If the load impedance increases, the slew rate of the output signal decreases, which can lead to timing issues and cause timing inconsistencies among various components of the IC 100 and the variable load 102. If the load impedance decreases, the slew rate of the output signal increases, resulting in power supply noise issues.

To account for changes in the slew rate of the output signal caused by changes in the load impedance, the slew rate of the output signal generated by the voltage-driver circuit must be corrected. The processor 106 can be programmed to generate the first and second control signals based on the type of the variable load 102. However, it is time consuming and impractical to program the processor 106 to correct the slew rate of the output signal for each type of the variable load 102. Further, it is difficult to program the processor 106 to account for changes in the load impedance caused by changing environmental conditions and aging. Therefore, there is a need for an IC that dynamically senses changes in the load impedance at the output of a voltage-driver circuit, and corrects the slew rate of the output signal to correspond to the load impedance.

A known technique to overcome the aforementioned problems uses a capacitive feedback circuit connected to the voltage-driver circuit. However, this technique can be used to only reduce the slew rate of the output signal. Another known technique uses pulse width comparison to detect changes in the load impedance and then correct the slew rate of the output signal. However, this technique requires generation of high frequency clock signals that are used for pulse width comparison when the output signal is a high frequency signal (e.g., 1 GHz). Yet another known technique uses a D-type flip-flop that has asynchronous inputs. However, since the inputs to the flip-flop are asynchronous, this technique may lead to stability issues and may malfunction.

Thus, it would be advantageous to be able to dynamically sense changes in the load impedance at the output of a voltage-driver circuit, correct the slew rate of the output signal without using a processor, flip-flops or clock generators, and prevent timing and power supply noise issues.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
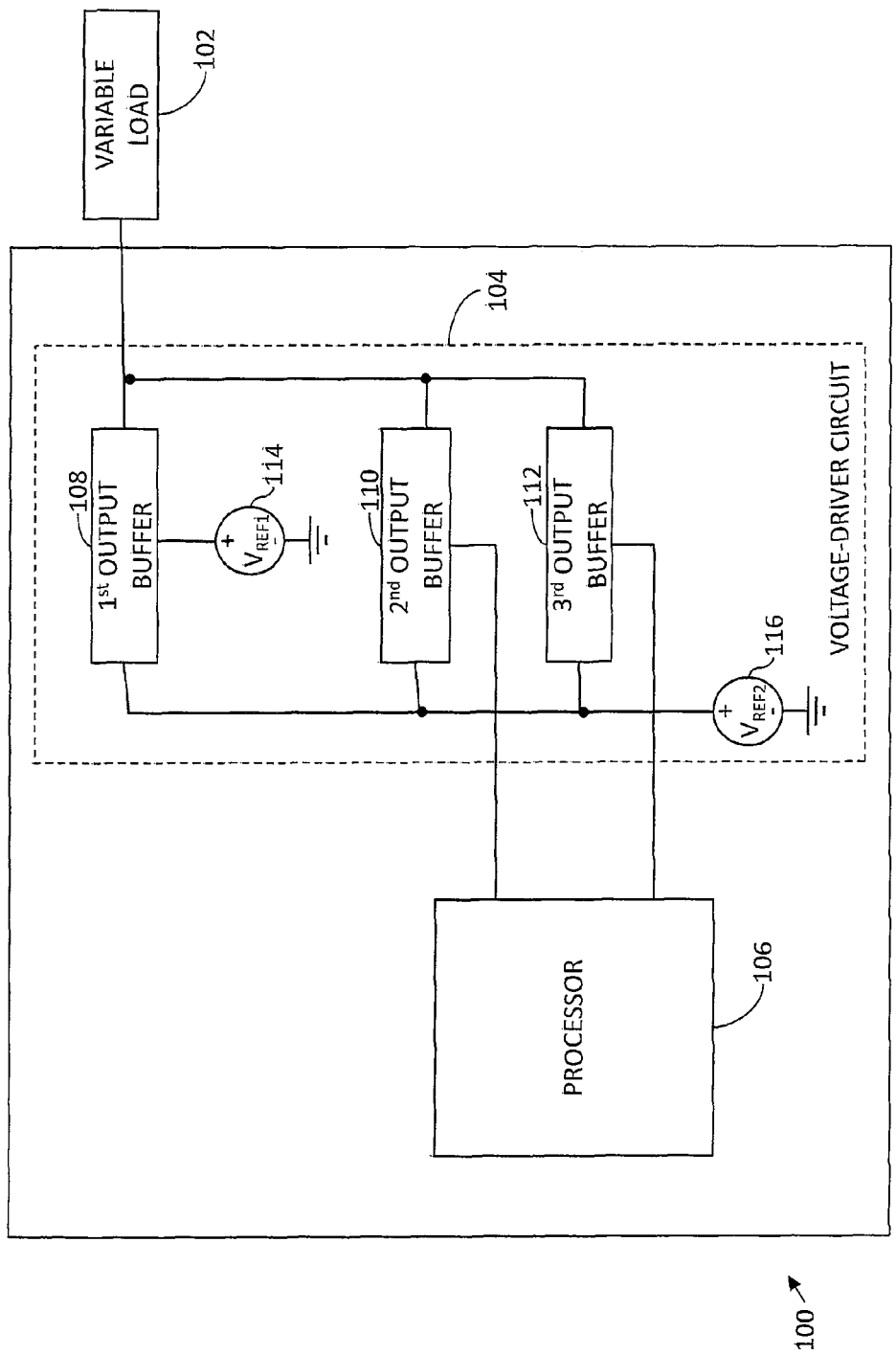
FIG. 1 is a schematic block diagram of a conventional integrated circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for dynamically adjusting a slew rate of an output signal is provided. The system includes a sampler, an envelope detector, an envelope comparison and control circuit, and a voltage-driver circuit. The sampler receives the output signal and generates a sampled signal indicative of the slew rate of the output signal. The envelope detector is connected to the sampler. The envelope detector receives the sampled signal and generates an envelope detection signal having a voltage level that is indicative of a peak value of a voltage level of the sampled signal. The envelope comparison and control circuit is connected to the envelope detector. The envelope comparison and control circuit receives the envelope detection signal, compares the voltage level of the envelope detection signal with a plurality of threshold voltage levels, and generates a plurality of control signals. The voltage-driver circuit is connected to the envelope comparison and control circuit. The voltage-driver circuit receives the plurality of control signals and generates the output signal, wherein the slew rate of the output signal is adjusted based on the plurality of control signals.

In another embodiment of the present invention, an integrated circuit for generating an output signal with a dynamically adjustable slew rate is provided. The integrated circuit includes a sampler, an envelope detector, an envelope comparison and control circuit, and a plurality of output buffers. The sampler receives the output signal and generates a sampled signal indicative of the slew rate of the output signal. The envelope detector is connected to the sampler. The envelope detector receives the sampled signal and generates an envelope detection signal having a voltage level that is indicative of a peak value of a voltage level of the sampled signal. The envelope comparison and control circuit is connected to the envelope detector. The envelope comparison and control circuit receives the envelope detection signal, compares the voltage level of the envelope detection signal with a plurality of threshold voltage levels, and generates a plurality of control signals. The plurality of output buffers are connected to the envelope comparison and control circuit. The plurality of output buffers receive the plurality of control signals and generate an output signal, wherein the slew rate of the output signal is adjusted based on the plurality of control signals.

In yet another embodiment of the present invention, a method for dynamically adjusting a slew rate of an output signal generated by a plurality of output buffers of an integrated circuit is provided. The slew rate of the output signal depends on an operation state of at least one output buffer of the plurality of output buffers. A sampled signal indicative of the slew rate of the output signal is generated. An envelope detection signal having a voltage level indicative of a peak value of a voltage level of the sampled signal is generated. Further, a plurality of control signals is generated based on a comparison between the voltage level of the envelope detection signal and a plurality of threshold voltage levels. An operation state of the at least one output buffer of the plurality of output buffers is configured based on the plurality of control signals. Thus, the slew rate of the output signal is adjusted based on the plurality of control signals.

Various embodiments of the present invention provide a system for dynamically adjusting a slew rate of an output signal. The system includes a sampler, an envelope detector, an envelope comparison and control circuit, and a voltage-driver circuit. The sampler receives the output signal and generates a sampled signal indicative of the slew rate of the output signal. Thus, the sampled signal indicates changes in the slew rate of the output signal that are caused due to changes in the load impedance. The envelope detector receives the sampled signal and generates an envelope detection signal having a voltage level that is indicative of a peak value of a voltage level of the sampled signal. The envelope comparison and control circuit receives the envelope detection signal, compares the voltage level of the envelope detection signal with a plurality of threshold voltage levels, and generates a plurality of control signals. The voltage-driver circuit receives the plurality of control signals and generates the output signal, wherein the slew rate of the output signal is adjusted based on the plurality of control signals. Thus, the system dynamically senses the changes in the load impedance at the output of the voltage-driver circuit and corrects the slew rate of the output signal to correspond to the changes in the load impedance, thereby preventing timing and power supply noise issues. The system does not require a clock generator, and hence can correct the slew rate of high frequency output signals. Further, the system does not require the use of a processor, and hence prevents the need of programming the processor, and reduces the efforts required to control the slew rate of the output signal.

Figure 2:
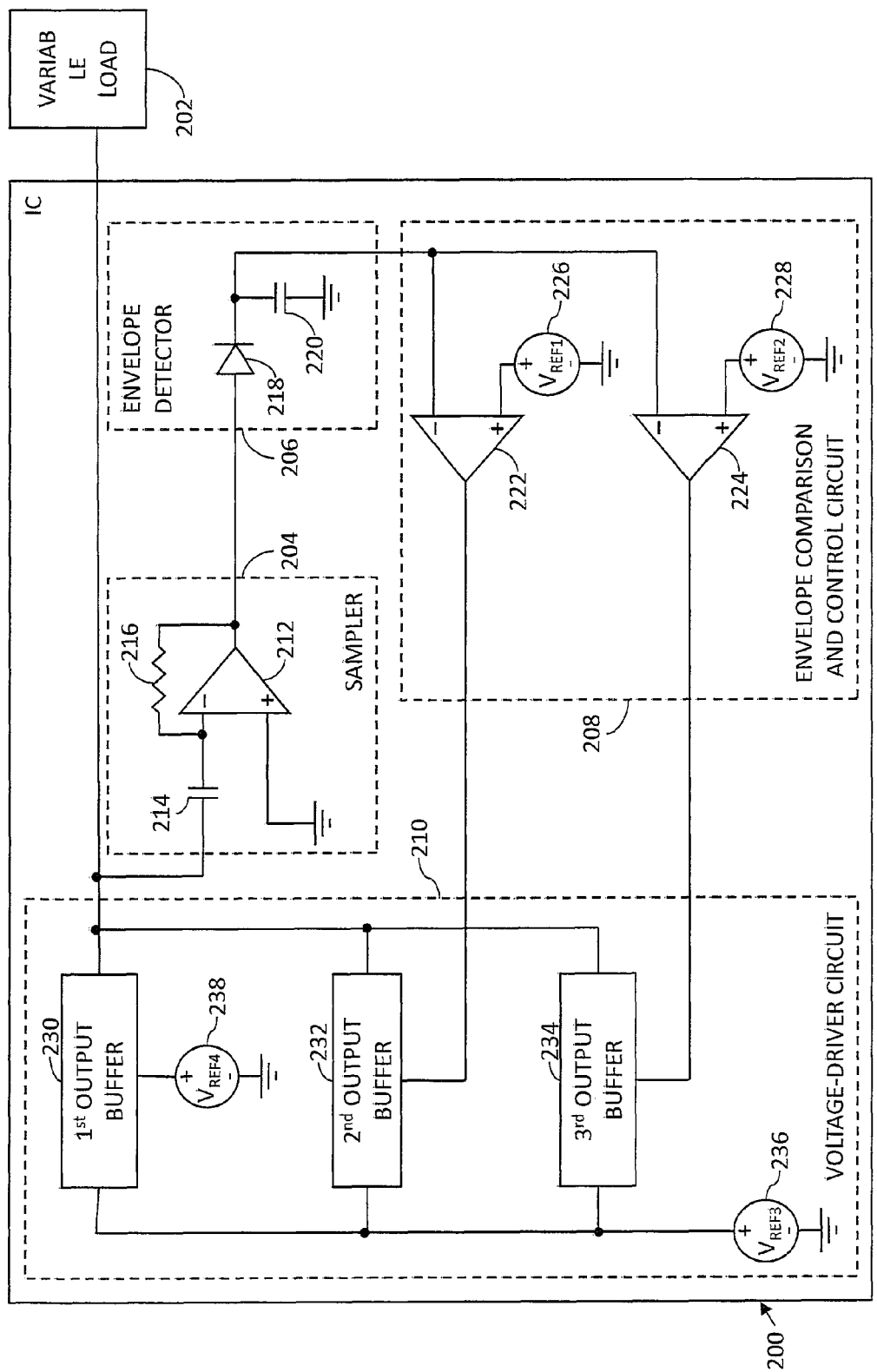
FIG. 2 is a schematic circuit diagram of an integrated circuit for generating an output signal with a dynamically adjustable slew rate in accordance with an embodiment of the present invention.

Referring now to FIG. 2, a schematic circuit diagram of an integrated circuit (IC) 200 for generating an output signal with a dynamically adjustable slew rate, in accordance with an embodiment of the present invention, is shown. The IC 200 is connected to a variable load 202 and includes a sampler 204, an envelope detector 206, an envelope comparison and control circuit 208, and a voltage-driver circuit 210.

The variable load 202 represents external components that are connected to the IC 200. Various types of external components are connected to the IC 200, examples of which include but are not limited to dynamic random access memories (DRAMs), double-data rate (DDR) memories, and Ethernet and universal serial data-bus (USB) devices. The variable load 202 is connected to the voltage-driver circuit 210 for receiving the output signal generated by the voltage-driver circuit 210. A printed circuit board (PCB, not shown) is used to mechanically support and electrically connect the voltage-driver circuit 210 of the IC 200 and the variable load 202. The variable load 202 consumes power and hence, results in load impedance at the output of the voltage-driver circuit 210. The load impedance changes based on the type of variable load 202, environmental conditions, such as ambient temperature and temperature of the PCB and aging. Generally, changes in the load impedance lead to a change in the slew rate of the output signal received by the variable load 202.

The sampler 204 is connected to the voltage-driver circuit 210 and the variable load 202. The sampler 204 includes a differentiation comparator circuit 212 having a non-inverting terminal connected to ground, an inverting terminal connected to the voltage-driver circuit 210 by way of a first capacitor 214 for receiving the output signal, and an output terminal connected to the inverting terminal by way of a feedback resistor 216 for generating the sampled signal. The sampler 204 samples the output signal and detects the rise and fall times of the output signal. Thus, the sampled signal is indicative of the slew rate of the output signal, and hence dynamically indicates changes in the load impedance at the output of the voltage-driver circuit 210.

The envelope detector 206 is connected to the sampler 204. The envelope detector 206 includes a diode 218 having a p-terminal connected to the output terminal of the differentiation comparator circuit 212 for receiving the sampled signal, and an n-terminal connected to ground by way of a second capacitor 220 for generating the envelope detection signal. The envelope detector 206 detects a peak envelope voltage of the sampled signal and generates the envelope detection signal that is proportional to the peak envelope voltage of the sampled signal.

The envelope comparison and control circuit 208 is connected to the envelope detector 206 and includes a plurality of comparator circuits (not shown). In an example, the envelope comparison and control circuit 208 includes first and second comparator circuits 222 and 224. The first comparator circuit 222 has a non-inverting terminal connected to a first reference voltage generator 226 for receiving a first reference voltage at a first threshold voltage level, an inverting terminal connected to the n-terminal of the diode 218 for receiving the envelope detection signal, and an output terminal for generating a first control signal. The first comparator circuit 222 generates the first control signal when the voltage level of the envelope detection signal exceeds the first threshold voltage level. In an embodiment of the present invention, the first comparator circuit 222 generates the first control signal at a voltage level indicative of a logic low state when the voltage level of the envelope detection signal exceeds the first threshold voltage level. The second comparator circuit 224 has a non-inverting terminal connected to a second reference voltage generator 228 for receiving a second reference voltage at a second threshold voltage level, an inverting terminal connected to the n-terminal of the diode 218 for receiving the envelope detection signal, and an output terminal for generating a second control signal. The second comparator circuit 224 generates the second control signal when the voltage level of the envelope detection signal exceeds the second threshold voltage level. In an embodiment of the present invention, the second comparator circuit 224 generates the second control signal at the voltage level indicative of the logic low state when the voltage level of the envelope detection signal exceeds the second threshold voltage level. In another embodiment of the present invention, the first threshold voltage level is higher than the second threshold voltage level.

The voltage-driver circuit 210 is connected to the envelope comparison and control circuit 208 and the variable load 202. The voltage-driver circuit 210 includes a plurality of output buffers (not shown) and is required to provide the output signal to the variable load 202 at a constant slew rate. Generally, output buffers include transistors, capacitors, and resistors. In an embodiment of the present invention, the voltage-driver circuit 210 includes first through third output buffers 230-234. The first output buffer 230 has an input terminal connected to a third reference voltage generator 236 for receiving a third reference voltage as a supply voltage signal, an enable terminal connected to a fourth reference voltage generator 238 for receiving a fourth reference voltage as an enable signal, and an output terminal for generating a first intermediate output signal having a first slew rate. The second output buffer 232 has an input terminal connected to the third reference voltage generator 236 for receiving the third reference voltage as the supply voltage signal, an enable terminal connected to the output terminal of the first comparator circuit 222 for receiving the first control signal, and an output terminal for generating a second intermediate output signal having a second slew rate. The third output buffer 234 has an input terminal connected to the third reference voltage generator 236 for receiving the third reference voltage as the supply voltage signal, an enable terminal connected to the output terminal of the second comparator circuit 224 for receiving the second control signal, and an output terminal for generating a third intermediate output signal having a third slew rate. The second and third output buffers 232 and 234 operate based on the first and second control signals. The voltage-driver circuit 210 collectively outputs a sum of the first, second and third intermediate output signals as the output signal. Thus, the slew rate of the output signal depends on the slew rates of the second and third intermediate output signals, and hence, depends on the operation states of the second and third output buffers 232 and 234.

In operation, when the load impedance at the output of the voltage-driver circuit 210 decreases, the slew rate of the output signal received by the variable load 202 increases. The sampler 204 generates the sampled signal indicative of the increased slew rate of the output signal, thereby indicating the decrease in the load impedance. The envelope detector 206 detects the peak envelope voltage of the sampled signal and generates the envelope detection signal. The envelope comparison and control circuit 208 compares the voltage level of the envelope detection signal with the first and second threshold voltage levels. Since the voltage level of the envelope detection signal exceeds the first and second threshold voltage levels, the envelope comparison and control circuit 208 generates the first and second control signals to switch off the second and third output buffers 232 and 234. In an embodiment of the present invention, the envelope comparison and control circuit 208 generates the first and second control signals at a voltage level indicative of a logic low state to switch off the second and third output buffers 232 and 234. Thus, the voltage-driver circuit 210 outputs only the first intermediate output signal having the first slew rate as the output signal, thereby dynamically decreasing the slew rate of the output signal to a desired value that meets a slew rate requirement of the variable load 202.

When the load impedance at the output of the voltage-driver circuit 210 increases, the slew rate of the output signal received by the variable load 202 decreases. The sampler 204 generates the sampled signal indicative of the decreased slew rate of the output signal. The envelope detector 206 detects the peak envelope voltage of the sampled signal and generates the envelope detection signal. The envelope comparison and control circuit 208 compares the voltage level of the envelope detection signal with the first and second threshold voltage levels. Since the voltage level of the envelope detection signal is less than the first and second threshold voltage levels, the envelope comparison and control circuit 208 generates the first and second control signals to switch on the second and third output buffers 232 and 234. In an embodiment of the present invention, the envelope comparison and control circuit 208 generates the first and second control signals at a voltage level indicative of a logic high state to switch on the second and third output buffers 232 and 234. Thus, the voltage-driver circuit 210 outputs the sum of the first, second and third intermediate output signals having the first, second and third slew rates as the output signal, thereby dynamically increasing the slew rate of the output signal to the desired value that meets the slew rate requirement of the variable load 202.

Further, if the voltage level of the envelope detection signal is less than the first threshold voltage level and greater than the second threshold voltage level, the envelope comparison and control circuit 208 generates the first and second control signals to switch on the second output buffer 232 and switch off the third output buffer 234. In an embodiment of the present invention, the envelope comparison and control circuit 208 generates the first control signal at a logic high state to switch on the second output buffer 232 and the second control signal at a logic low state to switch off the third output buffer 234. Thus, the voltage-driver circuit 210 outputs the sum of the first and second intermediate output signals having the first and second slew rates as the output signal, thereby maintaining the slew rate of the output signal at the desired value that meets the slew rate requirement of the variable load 202.

Thus, the sampler 204 dynamically senses the changes in the load impedance at the output of the voltage-driver circuit 210 caused due to change in the type of variable load 202, the environmental conditions, and aging. The envelope comparison and control circuit 208 dynamically corrects the slew rate of the output signal to correspond to the changes in the load impedance, thereby preventing timing and power supply noise issues. The IC 200 does not require clock signals to correct the slew rate of the output signal, and hence the IC 200 can correct high frequency output signals (e.g., when the output signal is generated with a frequency of 1 GHz). Further, the IC 200 does not require the use of a processor, and hence prevents the need of programming the processor and reduces the power consumed for controlling the slew rate of the output signal.

Figure 3A:
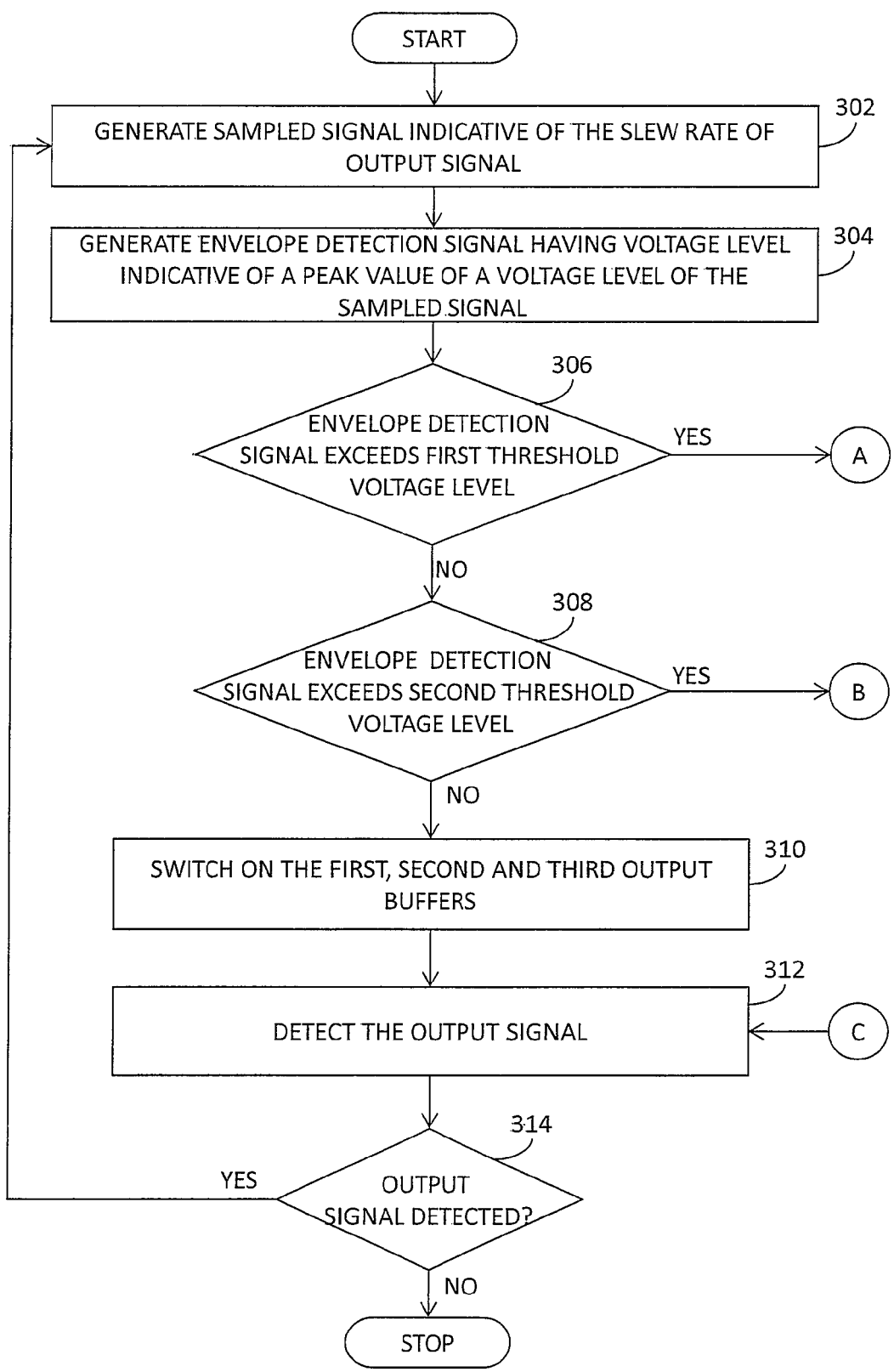
FIGS. 3A and 3B are a flow chart illustrating a method for dynamically adjusting a slew rate of an output signal in accordance with an embodiment of the present invention.
Figure 3B:
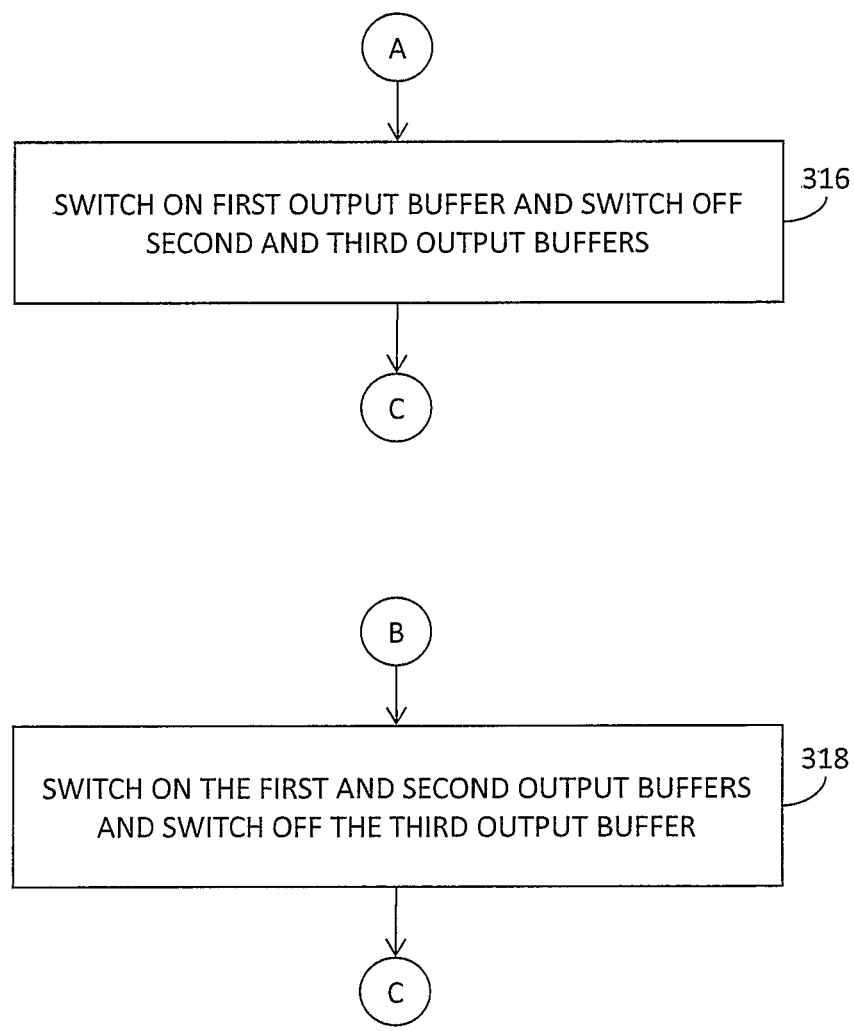

Referring now to FIGS. 3A and 3B, a flowchart illustrating a method for dynamically adjusting the slew rate of the output signal, in accordance with an embodiment of the present invention, is shown. At step 302, the sampler 204 generates the sampled signal indicative of the slew rate of the output signal. At step 304, the envelope detector 206 generates the envelope detection signal having the voltage level indicative of the peak value of the voltage level of the sampled signal. At step 306, the envelope comparison and control circuit 208 checks to determine whether the voltage level of the envelope detection signal exceeds the first threshold voltage level. If at step 306, the envelope comparison and control circuit 208 determines that the voltage level of the envelope detection signal is less than the first threshold voltage level, at step 308, the envelope comparison and control circuit 208 determines whether the voltage level of the envelope detection signal exceeds the second threshold voltage level. If the voltage level of the envelope detection signal is less than the second threshold voltage level, at step 310, the envelope comparison and control circuit 208 generates the first and second control signals to switch on the second and third output buffers 232 and 234. Thus, the first through third output buffers 230-234 are switched on and the slew rate of the output signal increases. At step 312, the sampler 204 samples the output signal to detect the output signal. At step 314, the sampler 204 checks to determine whether the output signal is detected. If at step 314, the sampler 204 determines that the output signal is detected, step 302 is executed.

However, if the voltage level of the envelope detection signal is greater than the first threshold voltage level indicating that the slew rate of the output signal has increased, at step 316, the envelope comparison and control circuit 208 generates the first and second control signals to switch off the second and third output buffers 232 and 234. Thus, only the first output buffer 230 is switched on and the slew rate of the output signal decreases.

If the voltage level of the envelope detection signal is greater than the second threshold voltage level, at step 318, the envelope comparison and control circuit 208 generates the first and second control signals to switch on the second output buffer 232 and switch off the third output buffer 234. Thus, the first and second output buffers 230 and 232 are switched on and the slew rate of the output signal is maintained at the desired value to meet the slew rate requirement of the variable load 202.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for adjusting a slew rate of an output signal, the system comprising:
a sampler for receiving the output signal and generating a sampled signal indicative of the slew rate of the output signal;
an envelope detector, connected to the sampler, for receiving the sampled signal and generating an envelope detection signal having a voltage level that is indicative of a peak value of a voltage level of the sampled signal;
an envelope comparison and control circuit, connected to the envelope detector, for receiving the envelope detection signal, comparing the voltage level of the envelope detection signal with a plurality of threshold voltage levels, and generating a plurality of control signals; and
a voltage-driver circuit, connected to the envelope comparison and control circuit, for receiving the plurality of control signals and generating the output signal, wherein the slew rate of the output signal is adjusted based on the plurality of control signals, wherein the sampler includes a differentiation comparator circuit having a non-inverting terminal connected to ground, an inverting terminal connected to the voltage-driver circuit by way of a first capacitor for receiving the output signal, and an output terminal connected to the inverting terminal by way of a feedback resistor for generating the sampled signal.

2. The system of claim 1, wherein the envelope detector includes a diode having a p-terminal connected to the output terminal of the differentiation comparator circuit for receiving the sampled signal and an n-terminal connected to ground by way of a second capacitor for generating the envelope detection signal.

3. The system of claim 2, wherein the envelope comparison and control circuit includes:
   a first comparator circuit having a non-inverting terminal for receiving a first reference voltage at a first threshold voltage level, an inverting terminal connected to the n—terminal of the diode for receiving the envelope detection signal, and an output terminal for generating a first control signal; and
   a second comparator circuit having a non-inverting terminal for receiving a second reference voltage at a second threshold voltage level, an inverting terminal connected to the n-terminal of the diode for receiving the envelope detection signal, and an output terminal for generating a second control signal.

4. The system of claim 3, wherein the first threshold voltage level is higher than the second threshold voltage level.

5. The system of claim 3, wherein the voltage-driver circuit includes:
   a first output buffer having an input terminal for receiving a supply voltage signal, an enable terminal connected to a supply reference voltage for receiving an enable signal, and an output terminal for generating a first intermediate output signal having a first slew rate;
   a second output buffer having an input terminal for receiving the supply voltage signal, an enable terminal connected to the output terminal of the first comparator circuit for receiving the first control signal, and an output terminal for generating a second intermediate output signal having a second slew rate; and
   a third output buffer having an input terminal for receiving the supply voltage signal, an enable terminal connected to the output terminal of the second comparator circuit for receiving the second control signal, and an output terminal for generating a third intermediate output signal having a third slew rate,
   wherein the output signal of the voltage-driver circuit is a sum of the first, second, and third intermediate output signals.

6. The system of claim 5, wherein the second and third output buffers are switched off when the envelope detection signal exceeds the first and second threshold voltage levels, thereby decreasing the slew rate of the output signal to a desired value, thereby meeting a slew rate requirement of an external load.

7. The system of claim 5, wherein the second output buffer is switched on and the third output buffer is switched off when the voltage level of the envelope detection signal is less than the first threshold voltage level and greater than the second threshold voltage level, thereby maintaining the slew rate of the output signal at a desired value, thereby meeting a slew rate requirement of an external load.

8. The system of claim 5, wherein the second and third output buffers are switched on when the voltage level of the envelope detection signal is less than the first and second threshold voltage levels, thereby increasing the slew rate of the output signal to a desired value, thereby meeting a slew rate requirement of an external load.

9. An integrated circuit for generating an output signal with an adjustable slew rate, the integrated circuit comprising:
   a sampler for receiving the output signal and generating a sampled signal indicative of a slew rate of the output signal;
   an envelope detector, connected to the sampler, for receiving the sampled signal and generating an envelope detection signal having a voltage level that is indicative of a peak value of a voltage level of the sampled signal;
   an envelope comparison and control circuit, connected to the envelope detector, for receiving the envelope detection signal, comparing the voltage level of the envelope detection signal with a plurality of threshold voltage levels, and generating a plurality of control signals; and
   a plurality of output buffers, connected to the envelope comparison and control circuit, for receiving the plurality of control signals and generating an output signal, wherein the slew rate of the output signal is adjusted based on the plurality of control signals,
   wherein the sampler includes a differentiation comparator circuit having a non-inverting terminal connected to ground, an inverting terminal connected to the plurality of output buffers for receiving the output signal, and an output terminal connected to the inverting terminal for generating the sampled signal.

10. The integrated circuit of claim 9, wherein the inverting terminal is connected to the plurality of output buffers by way of a first capacitor, and the output terminal is connected to the inverting terminal by way of a feedback resistor.

11. The integrated circuit of claim 10, wherein the envelope detector includes a diode having a p-terminal connected to the output terminal of the differentiation comparator circuit for receiving the sampled signal and an n-terminal connected to ground by way of a second capacitor for generating the envelope detection signal.

12. The integrated circuit of claim 11, wherein the envelope comparison and control circuit includes:
   a first comparator circuit having a non-inverting terminal for receiving a first reference voltage at a first threshold voltage level, an inverting terminal connected to the n-terminal of the diode for receiving the envelope detection signal, and an output terminal for generating a first control signal; and
   a second comparator circuit having a non-inverting terminal for receiving a second reference voltage at a second threshold voltage level, an inverting terminal connected to the n—terminal of the diode for receiving the envelope detection signal, and an output terminal for generating a second control signal.

13. The integrated circuit of claim 12, wherein the first threshold voltage level is higher than the second threshold voltage level.

14. The integrated circuit of claim 12, wherein the plurality of output buffers includes:
   a first output buffer having an input terminal for receiving a supply voltage signal, an enable terminal connected to a supply reference voltage for receiving an enable signal, and an output terminal for generating a first intermediate output signal having a first slew rate;
   a second output buffer having an input terminal for receiving the supply voltage signal, an enable terminal connected to the output terminal of the first comparator circuit for receiving the first control signal, an output terminal for generating a second intermediate output signal having a second slew rate; and
   a third output buffer having an input terminal for receiving the supply voltage signal, an enable terminal connected to the output terminal of the second comparator circuit for receiving the second control signal, and an output terminal for generating a third intermediate output signal having a third slew rate, wherein the output signal of the plurality of output buffers is a sum of the first, second, and third intermediate output signals.

15. The integrated circuit of claim 14, wherein the second and third output buffers are switched off when the envelope detection signal exceeds the first and second threshold voltage levels, thereby decreasing the slew rate of the output signal to a desired value, thereby meeting a slew rate requirement of an external load.

16. The integrated circuit of claim 14, wherein the second output buffer is switched on and the third output buffer is switched off when the voltage level of the envelope detection signal is less than the first threshold voltage level and greater than the second threshold voltage level, thereby maintaining the slew rate of the output signal at a desired value, thereby meeting a slew rate requirement of an external load.

17. The integrated circuit of claim 14, wherein the second and third output buffers are switched on when the voltage level of the envelope detection signal is less than the first and second threshold voltage levels, thereby increasing the slew rate of the output signal to a desired value, thereby meeting a slew rate requirement of an external load.

\* \* \* \* \*